US006435396B1

(12) United States Patent
Eldridge

(10) Patent No.: US 6,435,396 B1
(45) Date of Patent: Aug. 20, 2002

(54) PRINT HEAD FOR EJECTING LIQUID DROPLETS

(75) Inventor: Jerome M. Eldridge, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/546,084

(22) Filed: Apr. 10, 2000

(51) Int. Cl.[7] ............................................. B23K 3/06
(52) U.S. Cl. ........................ 228/33; 228/33; 228/260; 228/261; 347/1; 347/51; 347/54; 222/595; 222/603
(58) Field of Search ................................ 118/300, 302; 228/33, 37, 256, 260, 261; 347/77, 82, 54, 1, 51; 266/236; 222/595, 603; 239/79, 85

(56) References Cited

U.S. PATENT DOCUMENTS

| | | | | |
|---|---|---|---|---|
| 4,607,267 A | * | 8/1986 | Yamamuro | 347/51 |
| 5,364,011 A | | 11/1994 | Baker | 228/180.21 |
| 5,377,961 A | * | 1/1995 | Smith et al. | 266/237 |
| 5,401,191 A | | 3/1995 | Krage | 439/614 |
| 5,613,633 A | * | 3/1997 | French et al. | 228/264 |
| 5,779,971 A | * | 7/1998 | Tsung Pan et al. | 266/237 |
| 5,876,615 A | * | 3/1999 | Predetechensky | 222/590 |
| 5,894,980 A | * | 4/1999 | Orme-Marmarelis et al. | 228/33 |
| 5,988,480 A | * | 11/1999 | Farnworth | 228/33 |
| 6,015,083 A | | 1/2000 | Hayes | 228/254 |
| 6,076,723 A | * | 6/2000 | I-Tsung Pan | 228/33 |
| 6,121,131 A | | 9/2000 | Eldridge | 438/624 |
| 6,216,966 B1 | * | 4/2001 | Prendergast et al. | 239/690 |
| 6,224,180 B1 | | 5/2001 | Pham-Van-Diep | 347/2 |
| 6,288,437 B1 | | 9/2001 | Forbes | 257/530 |
| 6,322,202 B1 | * | 11/2001 | Ahn | 347/65 |

OTHER PUBLICATIONS

"Key Process Controls For Underfilling Flip Chips"—Alec J. Bablarz, Asymtek, Carlsbad, CA (Solid State Technology, Apr. 1997, pp. 77–78, 81, 83).
"Bumped Wafers—Worth Their Weight In Gold?"—Paul Jones and Jim Blaha (Advanced Packaging, Jan. 1999, pp. 55–57).
"Antifuse Structures, Methods, and Applications"; Ser. No. 09/259,363; Filed Feb. 26, 1999.
"Fluid Statics"—Eugene A. Avallone and Theodore Baumeister III, Editors (Marks' Standard Handbook For Mechanical Engineers).
"Gases and Metals"—Francis J. Norton (pp. 516–559).
"Flow of Gases Through Tubes and Orifices"—David G. Worden (pp. 80–117).

* cited by examiner

Primary Examiner—Laura Edwards
(74) Attorney, Agent, or Firm—Howrey Simon Arnold & White, LLP

(57) ABSTRACT

An embodiment of the present invention includes a disposable print head for ejecting controlled amounts of liquid (e.g., solder) at a high rate onto the surface (e.g., an integrated circuit) in close proximity to the ejecting source. The embodiment involves the use of a controlled burst of gas that is developed by rapidly heating a metallic hydride film with a laser to disassociate the hydrogen therefrom. The pressure created by the burst of hydrogen gas is used to eject an amount of a liquid (e.g., a solder) from an appropriate conduit that is fed liquid from a reservoir. The surfaces in the print head that contact the liquid are coated to assist in priming the print head for a subsequent ejection event.

46 Claims, 3 Drawing Sheets

PRINT HEAD FOR EJECTING LIQUID DROPLETS

FIELD OF THE INVENTION

This invention relates generally to the field of liquid ejection and specifically to a print head for ejecting liquid droplets.

BACKGROUND OF THE INVENTION

There are a growing number of technological applications that require means to inexpensively and precisely deposit small, controlled volumes of liquids. One of these important technologies involves the deposition of small solder bumps on the bond pads of integrated circuits to assist in their subsequent packaging. One of the most efficient and compact packaging schemes utilizing such solder bumps is the so-called flip chip or C4 (i.e., the Controlled Collapse Chip Connection) approach. This technology eliminates the need to wire bond connections from the bond pads to a packaging lead frame, and offers more connection pads, higher speeds, smaller die sizes, and improved heat transfer. See A. J. Babiarz, "Key Process Controls for Underfilling Flip Chips," pp. 77–83, Solid State Technology, April 1997, which is incorporated herein in its entirety. Although C4 technology is somewhat costly in terms of time, materials, and equipment, and although it presents certain environmental issues, the use of solder bumped integrated circuits is growing at a significant rate. See P. Jones & James Blaha, "Bumped Wafers: Worth Their Weight In Gold?" pp. 54–57, Advanced Packaging, January 1999, which is incorporated herein in its entirety.

The importance of this technology is underscored by the fact that a large number of companies and governmental agencies have formed the "MicroFab Consortium" for the purpose of exploring and developing novel methods for applying solder bumps and other materials to integrated circuits, hybrids, optical, and other devices. The literature suggests that MicroFab has successfully developed manufacturing prototypes of piezoelectrically actuated print heads for ejecting low-melting point solder balls of well-defined sizes at rates approaching a couple of kilohertz (kHz). Although piezoelectric-based printers have several attractive characteristics, they are limited by the fact that piezoelectric strengths decrease rapidly with rising temperatures and vanish at their Curie temperatures. Curie temperatures of useful ceramics are well under 300C. Thus the ability to manipulate solder viscosity and surface tension by raising temperature is limited in such print heads. Other significant disadvantages to using piezoelectric-based print heads includes their complexity and the great difficulty in mass producing them in large, inexpensive, relatively light weight arrays.

Thus, a need exists for a print head that is functional over a wider range of temperatures to eject a greater variety of solders, brazes and other materials. Preferably, such a print head would be easily produced in large quantities out of inexpensive materials such as silicon, glasses, and metals.

SUMMARY OF THE INVENTION

In view of the foregoing considerations, an embodiment of the present invention includes a disposable print head for ejecting controlled amounts of liquid (e.g., solder) at a high rate onto the surface (e.g., an integrated circuit) in close proximity to the ejecting source. The embodiment involves the use of a controlled burst of gas that is developed by rapidly heating a metallic hydride film with a laser to disassociate the hydrogen therefrom. The pressure created by the burst of hydrogen gas is used to eject an amount of a liquid (e.g., a solder) from an appropriate conduit that is fed liquid from a reservoir. The surfaces in the print head that contact the liquid are coated to assist in priming the print head for a subsequent ejection event.

BRIEF DESCRIPTION OF THE DRAWINGS

The foregoing and other features and aspects of the present invention will be best understood with reference to the following detailed description of a specific embodiment of the invention, when read in conjunction with the accompanying drawings, wherein.

DETAILED DESCRIPTION OF AN EMBODIMENT OF THE INVENTION

In the disclosure that follows, in the interest of clarity, not all features of actual implementations are described. It will of course be appreciated that in the development of any such actual implementation, as in any such project, numerous engineering and design decisions must be made to achieve the developers' specific goals and subgoals (e.g., compliance with system- and business-related constraints), which will vary from one implementation to another. Moreover, attention will necessarily be paid to proper engineering and design practices for the environment in question. It will be appreciated that such a development effort might be complex and time-consuming, but would nevertheless be a routine undertaking for those of ordinary skill in the field of semiconductordesign.

I. Titanium Hydride Decomposition as a Pressure Source

In an embodiment of the invention, liquid solder is ejected from an array of conduits by a burst of hydrogen gas created by thermally decomposing a titanium hydride ($TiH_2$) film. Thermal decomposition of metal hydrides and the bursts created thereby have been used in a number of different applications, including forming thin ductile metal conductor lines over a dielectric spacer layer, see Jerome M. Eldridge, "Method for Forming Conductive Structures", Ser. No. 09/385,579, and forming anti-fuse structures, see L. Forbes & Jerome M. Eldridge, "Antifuse Structures, Methods and Application", Ser. No. 09/258,363. Both of these patent applications are incorporated herein by reference in their entirety.

The present disclosure makes use of hydrogen gas pressure bursts which are generated by heating small volumes of $TiH_2$ or other similar materials to their disassociation temperatures (usually on the order of 200 to 800 C) in a relatively enclosed volume. The temperature at which the hydrogen disassociates from a given film depends on the particular hydride involved. Vanadium hydride begins to decompose at temperatures of around 200 C while titanium hydride begins to decompose at around 500 to 600 C. See S. Dushman & J. M. Lafferty, "Scientific Foundations of Vacuum Technique", J. Wiley & Sons, Chapter 8 (1962), which reviews hydrogen solubility and hydrogen disassociation in a wide range of metals, and which is incorporated herein by reference in its entirety. While the precise hydrogen desorption kinetics depend on such variables as grain size and oxygen content, it is clear that hydrogen evolves virtually spontaneously from titanium hydride at temperatures between approximately 600 and 700 C. While $TiH_2$ is preferred as the pressure source in the embodiment of the invention disclosed herein, other metal hydrides, oxides, and nitrides behave similarly and may also be useful. See L. Forbes & Jerome M. Eldridge, "Antifuse Structures, Methods and Application", Ser. No. 09/258,363.

Figure 1:
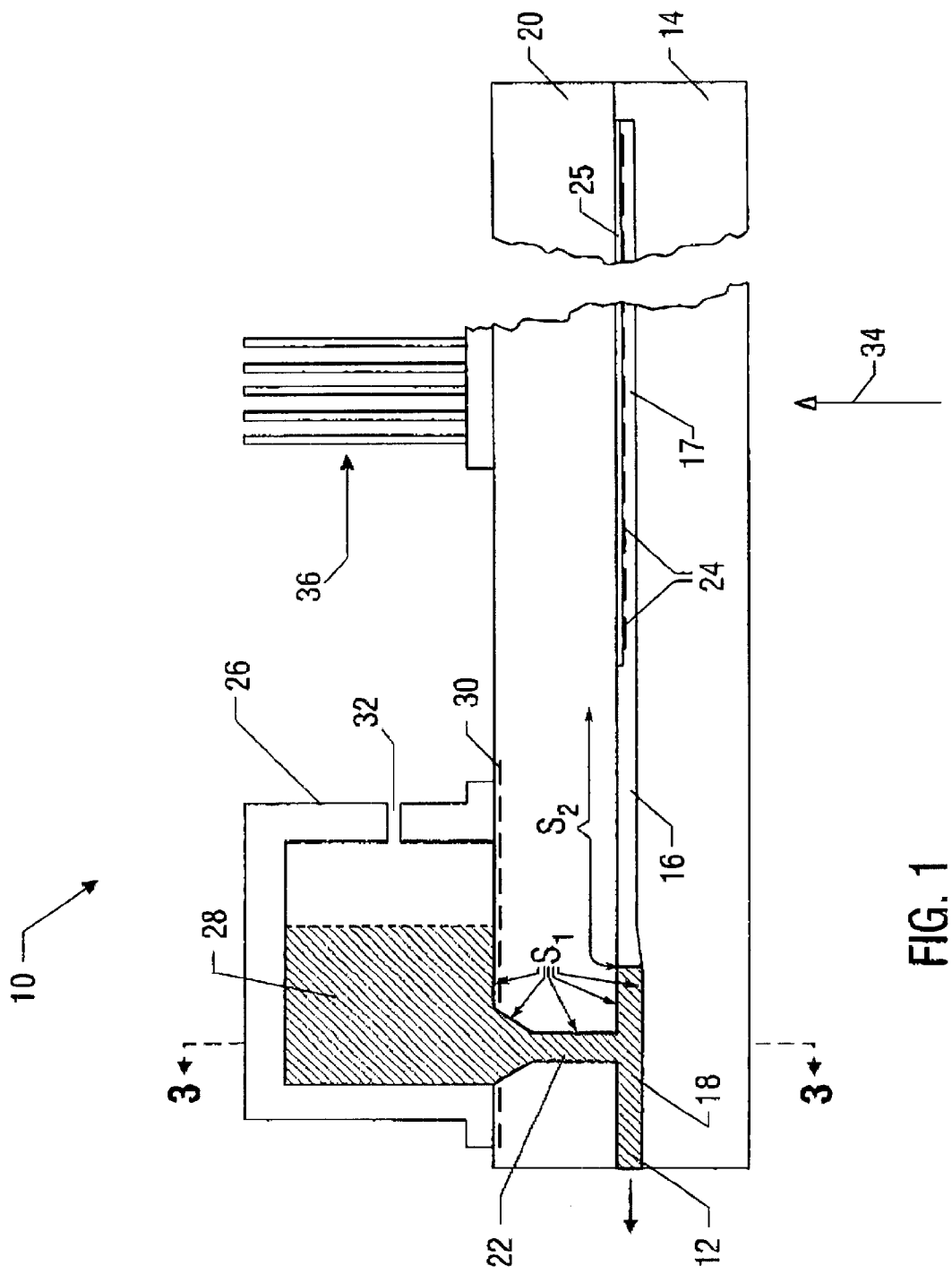
FIG. 1 shows a cross-section through one channel of the disclosed novel solder-ejecting print head.

II. A Disposable Print Head Design for Ejecting Solder Onto an Integrated Circuit An embodiment of the inventive print head 10 is disclosed in FIGS. 1 to 3. The print head 10 would normally be oriented such that solder ejection port 12 pointed downward in the direction of gravity; however, the Figures are drawn at 90 degrees from this orientation for clarity. One skilled in the art will recognize that the print head 10 in an actual manufacturing environment would likely be suspended over an integrated circuit (or other appropriate substrate) for ejection of solder (or other appropriate liquid) thereupon. Also, the print head 10 would normally be connected to appropriate electronics at contact pads 38 to pass signal thereto and to a stepper motor to position the print head 10 in the appropriate locations over the integrated circuit. Moreover, an ambient stream of an inert gas or a surrounding vacuum system would ordinarily be used to prevent oxidation of the solder during its ejection and to regulate cooling of the solder bump on the integrated circuit. (The vacuum may also be helpful in removing spent hydrogen gas from the print head apparatus). However, because these details are known to one of skill and are not important to understanding the embodiment of the invention, only the details of the print head, and not its surrounding environment, are discussed in detail.

The print head 10 includes a transparent glass substrate 14 which has a gas conduit 16 and a solder conduit 18 etched therein. The print head 10 also includes a silicon wafer 20 which has a solder feed-through 22 etched therein. The various structures can be formed on the silicon wafer 20 and glass 14 by a variety of different well-known processes known in the art of semiconductor fabrication, including the use of wet etching and reactive ion etching. The silicon wafer 20 and glass 14 are separately prepared with the appropriate structures and then bonded together, for example, by use of a low melting glass or epoxy, or by Mallory bonding.

Prior to the bonding of the silicon wafer 20 and glass 14, an dielectric such as a silicon dioxide 25 ("oxide") is formed on the silicon wafer. Oxide 25 can be either thermally grown or deposited, and may be selectively etched away in unwanted locations if desired. Thereafter, an array of small islands (or a single large film) of titanium is formed on oxide 25, for example, by titanium sputtering and etching. The titanium islands are then converted to $TiH_2$ islands 24 by exposing the titanium to hydrogen at a temperature of approximately 300 to 500 C. At hydrogen pressures of 0.1 to 1.0 atmospheres, the titanium will be converted into a hydride within a few tens of seconds to a couple of minutes, depending on the specific hydrogenation conditions and the structural morphology and purity of the titanium. Note that this hydrogenation of the titanium can be accomplished after the silicon wafer 20 is joined to the glass substrate 14.

Figure 2:
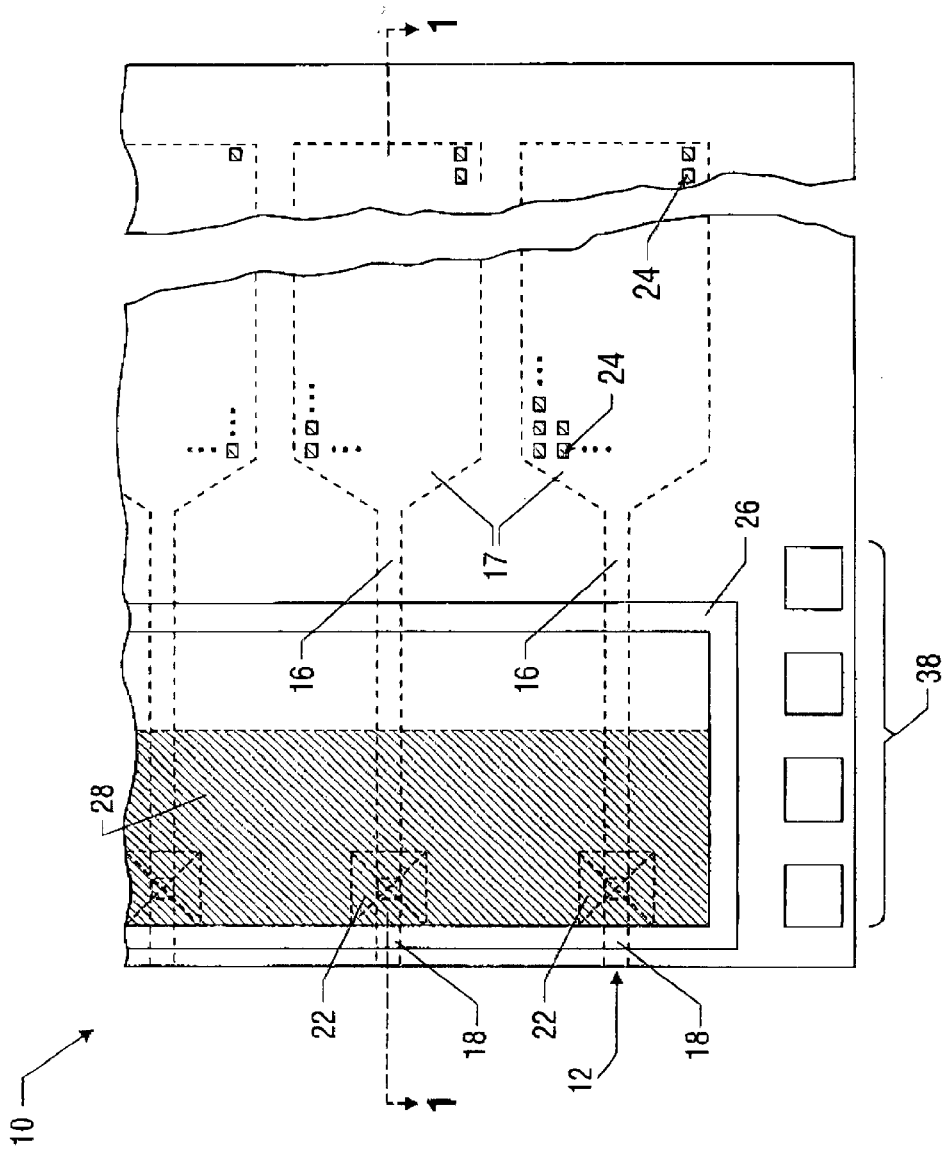
FIG. 2 shows a top-view perspective of the print head of FIG. 1.
Figure 3:
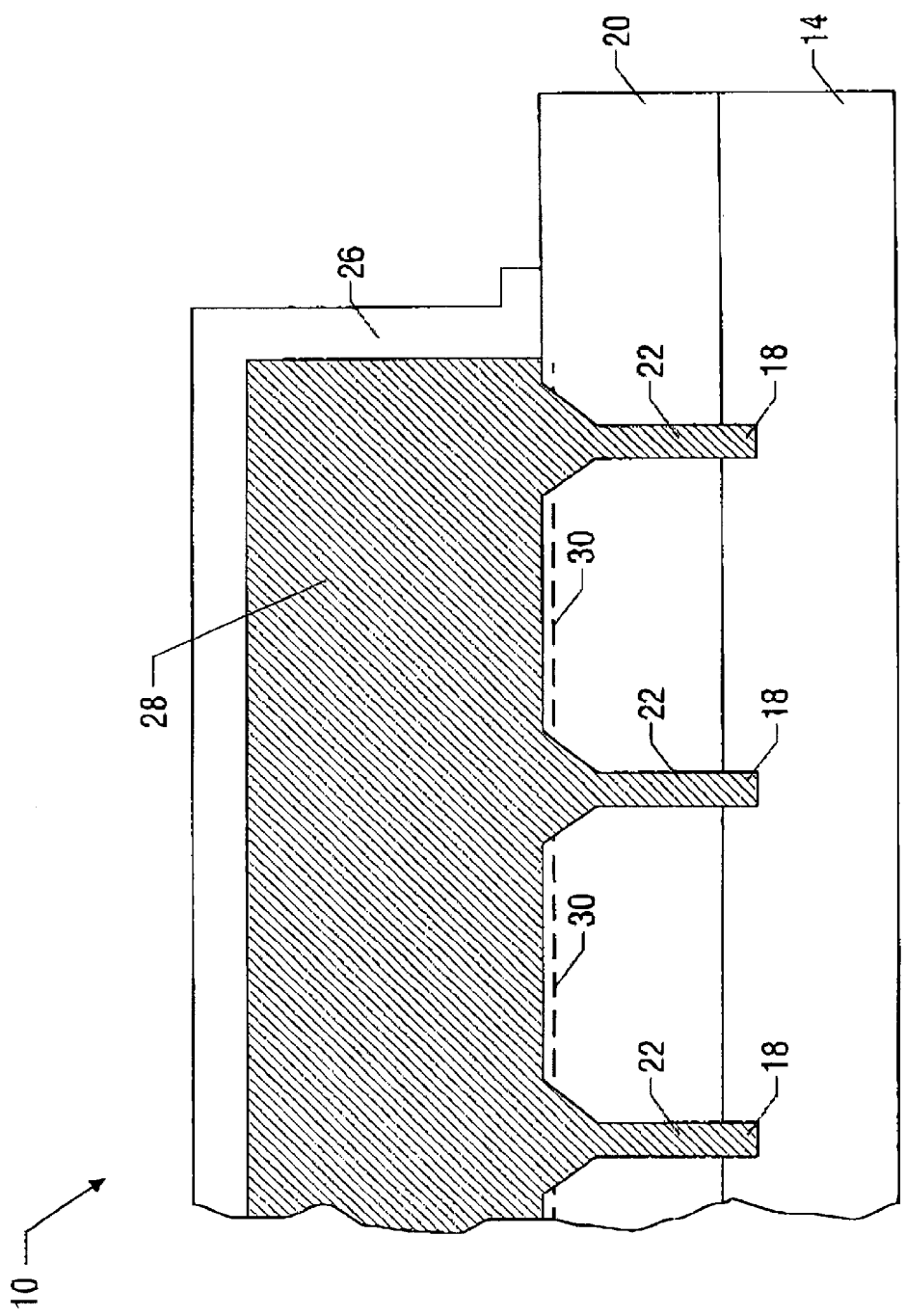
FIG. 3 shows a cross-section through the print head taken at 90 degrees to the cross-section of FIG. 1.

The space in which a group of $TiH_2$ islands are found is referred to herein as a "chamber" 17. Each chamber 17 provides the pressure source for a single "channel" in the print head 10, the channel being the combination of a chamber 17, a gas conduit 16, solder conduit 18, solder flow-through 22, and solder ejection port 12, as shown in cross-section in FIG. 1. In an actual commercial embodiment, print head 10 would likely have several channels (three are shown in FIG. 2) so that a row of solder bumps may be printed at one time.

A glass solder reservoir 26 is formed independently and is filled with a sufficient amount of solder 28 to produce a desired number of solder bumps on the integrated circuits served by the print head 10. The solder reservoir 26 can be joined to the silicon wafer 20 in a variety of ways, including the use of a low melting glass or epoxy, or by Mallory bonding. The solder reservoir 26 itself can be formed in a couple of ways. One way is to metallurgically cast the solder into a shape that fits the reservoir. This cast can then be placed inside the reservoir 26 before it is joined to the silicon wafer 20. Alternatively, the solder reservoir can have a cover plate. In this embodiment, the main body of the reservoir 26 would be joined to the silicon wafer 20 and then the solder cast would be added. Then, the cover plate would be joined to the reservoir main body. This joining process would, as one of skill in the art would recognize, depend on the melting temperature of the solder as well as the temperature needed to do the bonding. The solder reservoir 26 also includes a vent hole 32 to equalize the pressure inside of the reservoir after an amount of solder has been ejected from the print head 10.

After connection to the silicon wafer 20 and during operation of the print head, current will be passed through a resistive heating element 30 which is built into or on the silicon wafer 20 below the solder reservoir 26. The resistive heating element 30 when activated should exceed the melting point of the solder 28 in the solder reservoir 26, allowing it to flow through solder feed-through 22 into solder conduit 18 and out of solder ejection port 12 when ejected. A suitable resistive heating element 30 can be fabricated in a number of ways, but it is presently preferred to form the resistor as a passivated thin film resistor, or a diffused resistor structure built into the silicon wafer 20. Furthermore, the geometry of the resistive heating element 30 is preferably a single "serpentine" structure underlying the entire solder reservoir 26, although this is not shown in the Figures. The two ends of the resistive heating element 30 can be connected to contact pads 38 (FIG. 2) so that current may be passed therethrough by the print head electronics (not shown). Additionally, the print head 10 may include additional temperature sensing and control circuitry to optimize the temperature of solder 28.

Prior to the interconnection of the silicon wafer 20, glass 14, and solder reservoir 26, portions of the silicon wafer 20 (including the solder flow-through 22) and glass 14 (including solder conduit 18), and the entire interior of the solder reservoir 26, are covered 11 by a non-oxidizable metal film. These portions are labeled "$S_1$" in FIG. 1. Such metal films are preferably formed at portions $S_1$ by various well-known processes including physical sputtering and chemical vapor deposition of a suitable non-oxidizable metal, such as platinum, rhodium, palladium, gold and perhaps nickel (which forms only 10 angstroms of "tarnishing oxide" under clean conditions). The function of the non-oxidizable metal film is to treat those surfaces that will be in contact with the molten solder 28 during operation of the print head so that the solder 28 wets them. Due to surface tension effects, and assisted by gravity, the molten solder 28 will wet only the surfaces covered by the non-oxidizable metal film. In this manner, the solder conduit 18 will be "self-primed" with solder 28 after each ejection event.

The portions not coated with the non-oxidizable metal (including the gas conduit 16), labeled "$S_2$," are coated with a thermodynamically stable, clean oxide, such as silicon dioxide, aluminum oxide, etc. These portions will not be wetted by the molten solder 28. See E. A. Avallone & T. Baumeister III, "Mark's Standard Handbook for Mechanical Engineers, $10^{th}$ Ed.", pg. 3–33, McGraw Hill, (1996), discussing the strong capillary-induced depression of a non-wetting metal in a glass tube whose diameter decreases to small values on the order of less than 1 mil, and which is incorporated herein by reference in its entirety. Optionally, the $S_2$ portions may be coated by other materials that control the incursion of other liquids that might be used with this invention. A perfluoroalkoxy copolymer such as DuPont Teflon® 340 PFA is one example. This polymer has excellent high-temperature properties and the low surface energy characteristic of Teflon. While not necessary in an application involving the ejection of solder, a material such as Teflon would be necessary when ejecting liquids that wet oxides. In any event, the force of gravity will tend to keep solder from flowing upwards by capillary action into the gas conduit 16 and chamber 17 regardless of the surface treatment of the $S_2$ portions.

During operation of the print head 10, a small-spot (e.g., approximately 1 micrometer squared) laser beam 34 is rastered through the glass 14 and onto the $TiH_2$ islands 24 to generate hydrogen within the chamber 17. This sudden release of hydrogen creates a suitably high pressure of hydrogen gas within chamber 17 to eject the solder 28 in solder conduit 18 out solder ejection port 12 and onto the integrated circuit below. Cooling fins 36 may be mounted on the top of silicon wafer 20 in order to screen away from chamber 17 the excessive heat generated by the laser beam 34, thus minimizing the unwanted release of hydrogen from the $TiH_2$ islands 24 that are not struck with the laser beam 34. As an alternative to the laser beam, an array of passivated thin film resistors or diffused resistors could be formed on or in the silicon wafer 20 to rapidly heat the $TiH_2$ islands 24 to their decomposition temperatures. However, in view of the large number of $TiH_2$ islands 24, the electronics to control the heating of each individual island might be unnecessarily complicated when compared with the use of the laser beam 34.

The oxide 25 that underlies the $TiH_2$ islands 24 is essential for optimizing heat transfer from the laser to the islands. Oxide 25 is much less thermally conductive than the underlying silicon that comprises silicon wafer 20 and thus serves to sharpen the temperature rise experienced by the $TiH_2$ islands 24 during exposure to laser beam 34. In other words, oxide 25 thermally isolates the $TiH_2$ islands 24 from the other components in the system. The thickness of oxide 25 should be thick enough to provide a suitably quick temperature rise to the islands 24, but should also be thin enough to allow heat to diffuse from the islands 24 to the cooling fins 36 during the time period between laser strikes. Finite element analysis can be employed to optimize the thickness of oxide 25. In addition, the location at which the laser beam 34 strikes the $TiH_2$ islands 24 can varied to optimize the cooling of the chambers 17. For example, the laser beam 34 can be made to strike an island 24 on the right side of the chamber 17, followed by a strike on an island on the left side of the chamber, etc.

Ill. Theory of Operation

A few estimates of several critical parameters are provided to illustrate the feasibility of the disclosed embodiment of the invention. These estimates are based on the desire to print an array of 80 by 80 solder bumps with 40 micrometer diameters onto an integrated circuit with 150 micrometer centers. Accordingly, to maximize printing speed, the print head 10 would contain 80 solder ejection ports 12 (and their related structures) separated at a distance of 150 micrometers from each other. This would result in a print head 10 which is approximately one-half an inch in length.

A hemispherical solder bump that is 40 micrometers in diameter is equivalent to a cylindrical volume which is 40 micrometers in diameter and 13.3 micrometers in length. (As an alternative, a solder cylinder 53.2 micrometers in length by 20 micrometers in diameter would yield a solder bump of the same volume. This assumes, of course, that surface tension forces are sufficient during the time of flight to significantly reshape the elongated projectile to a relatively rounded one or alternatively that reshaping would take place mainly on the substrate). Assuming that solder 28 is predominantly comprised of lead and thus has a density of approximately 10 $g/cm^3$, the mass of the solder bump is approximately $2.67 \times 10^{-8}$ g or $5.88 \times 10^{-11}$ lbs. Neglecting surface energy effects in the solder conduit 18, the steady-state pressure required to support that mass in a solder conduit 18 that is 40 micrometers in diameter is extremely small, approximately $3.0 \times 10^{-5}$ $lbs/in^2$ or $2.0 \times 10^6$ atm.

Given that the solder bumps are to be deposited with 150 micrometer separations between channels, a reasonable size for any given chamber 17 is 100 by 800 micrometers. Such a chamber 17 can include a continuous $TiH_2$ film or an array of $TiH_2$ islands 24 as shown in FIG. 2. With a chamber of this size, 20,000 1 micrometers $TiH_2$ islands 24 can be fabricated for each chamber 17, assuming that the $TiH_2$ film covers only 25% of the available chamber area for any given channel.

Table I below provides estimates of the maximal hydrogen pressures that are achievable for various sizes of chambers 17 and $TiH_2$ islands 24. In making these estimates, it was assumed that all of the hydrogen is released from the indicated $TiH_2$ island. The hydrogen pressure is assumed to rise stepwise in this temporarily closed volume in a time (probably less than several microseconds) that is too short to realize solder ejection from the solder ejection port 12. As one example, a 1 by 1 by 3 micrometers $TiH_2$ island 24 contains approximately $5.39 \times 10^{-9}$ $cm^3$ of hydrogen at 25 C and 1 atm. If the space between the glass plate and the top of the $TiH_2$ film is set at 1 micrometer and the $TiH_2$ film is assumed to be continuous (not patterned into islands), the hydrogen pressure buildup within the space in the 100 by 800 by 1 $micrometer^3$ ($8 \times 10^{-8}$ $cm^3$) chamber 17 will be approximately 0.07 atm or 1 psi. Recall that the pressure required to support the mass of a 40 micrometer diameter bump in a 40 micrometer diameter solder conduit 18 was estimated to be only $3.0 \times 10^{-5}$ psi. The force generated by the hydrogen release in this case is therefore over 30,000 times greater than that needed to support the mass of the solder 28. Indeed, in each of the examples provided in Table I, the estimated hydrogen pressure is at least a few orders of magnitude greater than the estimated pressure needed to support the mass of solder 28, suggesting that the disclosed embodiment would operate as desired to effectuate suitable ejection of the solder out of the solder ejection port 12 and onto the integrated circuit below.

It is difficult to estimate the velocity at which the solder is ejected from the solder ejection port 12. As one skilled in the art of fluid mechanics would realize, such estimates would involve a number of factors including the solder viscosity, the surface energy differences between the solder 28 and non-oxidizable metal coating that surrounds it, the dimensions of the solder conduit 18, the temperature, the external pressure, and the shapes and magnitudes of the hydrogen pressure-time waveforms. However, unlike the piezoelectric print heads of the prior art, the disclosed embodiments can be made to function at higher temperatures if it is desirable to increase the ejection velocity. The diffusivity of hydrogen in titanium coupled with the relative thinness of the $TiH_2$ sources indicates that the hydrogen can be released in less than a microsecond, provided the hydride temperature can be raised just as rapidly to values on the order of approximately 700 to 800 C. See S. Dushman and J. M. Lafferty, "Scientific Foundations of Vacuum Technique," J. Wiley & Sons, Chapter 8, (1962) (discussing hydrogen solubility and hydride formation in a wide range of metals, which is incorporated herein by reference in its entirety). Notwithstanding these physical observations, the fact that the chamber pressure is a few orders of magnitude greater than that necessary to support the solder mass (as discussed in the last paragraph) suggests that the ejection velocity of any of the embodiments disclosed in Table I will be sufficient.

It is essential to remove at least part of the hydrogen inside the chamber 17 after solder 28 is ejected. Otherwise the solder conduit 18 cannot be re-primed with fresh solder via capillary action. Since the capillary forces are quite strong, however, it is probably only necessary to reduce the hydrogen pressure in the chamber 17 to a value that is perhaps one or two orders of magnitude below the maximum ejection pressure. In this regard, estimates were made of the time required for hydrogen removal assuming that the print head 10 was operating in a vacuum ambient. For the purpose of this estimation, the hydrogen outflow through the channel can be treated as a viscous gas flow through a cylindrical tube. See S. Dushman & J. M. Lafferty, Chapter 2, discussing the flow of gases through tubes and orifices, which is incorporated by reference in its entirety. Assume that this tube is 40 micrometers in diameter by 80 micrometers in length. The conductance of air has been well-studied and would be approximately $53 \times 10^{-3}$ $cm^3$/sec through a tube of these dimensions at 25 C, and conductance of hydrogen is about twice this value. Factoring in such parameters as the average mean free path allows one to determine the time to evacuate a chamber from atmospheric pressure to various smaller values. For the small volume ($8 \times 10^{-8}$ $cm^3$) of the chamber disclosed, a conductance of $\sim 53 \times 10^{-3}$ $cm^3$/sec is sufficient to lower the pressure in chamber 17 from $10^6$ to $10^5$ microns of mercury in about $6.3 \times 10^{-7}$ seconds. An additional $6.3 \times 10^{-6}$ seconds will lower the pressure by yet another order of magnitude.

Thus, it is estimated that the solder conduit 18 will be refilled with solder 28 in perhaps 10 to 20 microseconds. This should represent an improvement over thermal ink jet print heads of the same dimension, which take less than a millisecond to refill. However, if it is conservatively assumed that the disclosed embodiment will take 1 millisecond to refill, any given channel in the disclosed print head 10 could operate at an ejection rate of $10^3$ Hz. Thus, it would take about 80 milliseconds to print an integrated circuit with an array of 80 by 80 solder bumps. Since the number of $TiH_2$ islands 24 in each channel can vary from roughly 10,000 to 40,000, a print head built in accordance with the disclosed embodiment should be able to print between 125 to 500 integrated circuits.

From the foregoing detailed description of a specific embodiment of the invention, it should be apparent that an improved print head for ejecting liquid droplets has been disclosed. Although specific embodiments of the invention have been disclosed herein in some detail, this has been done solely for the purposes of illustrating various aspects and features of the invention, and is not intended to be limiting with respect to the scope of the invention. It is contemplated that various substitutions, alterations, and/or modifications, including but not limited to those design alternatives which might have been specifically noted in this disclosure, may be made to the disclosed embodiment without departing from the spirit and scope of the invention as defined in the appended claims. For example, it will be obvious to those skilled in the art who read this disclosure that a wide variety of other materials could be ejected using this technique, including: thermal plastics, thermosetting plastics, water-based adhesives, tacky and etching fluxes, polymeric solutions of organic compounds, silicones, and high melting "silver-brazing" alloys. It will also be obvious that other gas sources other than $TiH_2$ could be used as the pressure source. Moreover, the disclosed technique could be used to produce "micro-extrusions" of alloys or other materials having complex (e.g., toroidal) cross-sections.

TABLE I

ESTIMATED CHAMBER PRESSURES FOR VARIOUS GEOMETRIES*

| Chamber | | | Chamber | | $TiH_2$ | | Releasable $H_2$ | Chamber Press. | |
| --- | --- | --- | --- | --- | --- | --- | --- | --- | --- |
| Area | | Height | Free Vol. ($cm^3$) | Area | | Height | Volume ($cm^3$) | atm | psi |
| 100 × 800 | | 1 | $8 \times 10^{-8}$ | 1 | | 3 | $5.46 \times 10^{-9}$ | 0.068 | 1.0 |
| 100 × 800 | | 5 | $40 \times 10^{-8}$ | 1 | | 3 | $5.46 \times 10^{-9}$ | 0.014 | 0.2 |
| 100 × 400 | | 1 | $4 \times 10^{-8}$ | 2 | | 5 | $1.82 \times 10^{-8}$ | 0.46 | 6.70 |
| 100 × 100 | | 5 | $5 \times 10^{-8}$ | 9 | | 10 | $1.64 \times 10^{-7}$ | 3.3 | 48.2 |
| 100 × $10^3$ | | 10 | $1 \times 10^{-6}$ | 9 | | 10 | $1.64 \times 10^{-7}$ | 0.16 | 2.4 |

(*Chamber and $TiH_2$ Height given in micrometers. Chamber height refers to the distance between top of the metallic hydride and the glass plate. $H_2$ volumes are at STP.)

What is claimed is:

1. An apparatus for ejecting a liquid material out an ejection port, comprising:
    a gas chamber, wherein the gas chamber contains a film from which a gas disassociates when the film is heated by a heating source;
    a conduit in communication with the gas chamber, wherein the conduit contains the liquid material to be ejected; and
    an ejection port in communication with the conduit through which the liquid material is ejected.

2. The apparatus of claim 1, wherein the liquid material is solder.

3. The apparatus of claim 1, wherein the film is a metallic hydride.

4. The apparatus of claim 3, wherein the metallic hydride is $TiH_2$.

5. The apparatus of claim 3, wherein the metallic hydride consists of $TiH_2$ islands.

6. The apparatus of claim 1, further comprising a reservoir in communication with the conduit to provide the liquid material thereto.

7. The apparatus of claim 6, wherein both the conduit and the reservoir have a surface in contact with the liquid material and wherein the conduit surface and the reservoir surface are coated with a non-oxidizable metal.

8. The apparatus of claim 6, further including a heating element in proximity to the reservoir to heat the liquid material.

9. The apparatus of claim 1, wherein the apparatus is disposable.

10. The apparatus of claim 1, wherein the conduit has a surface in contact with the liquid material and wherein the conduit surface is coated with a non-oxidizable metal.

11. The apparatus of claim 1, further comprising a laser acting as the heating source, wherein the laser strikes the film to disassociate a gas therefrom into the gas chamber.

12. The apparatus of claim 11, wherein the gas is hydrogen.

13. The apparatus of claim 1, further comprising a heating element acting as the heating source, wherein the heating element heats the film to disassociate hydrogen therefrom into the gas chamber.

14. The apparatus of claim 1, wherein the film is comprised of a plurality of islands.

15. The apparatus of claim 1, further comprising an insulator which thermally isolates the film from the other components of the apparatus.

16. The apparatus of claim 1, further comprising a cooling device in proximity to the gas chamber for drawing heat therefrom.

17. The apparatus of claim 16, wherein the cooling device is a cooling fin.

18. An apparatus for ejecting a liquid material out an ejection port onto a work piece, comprising:
a first substrate;
a second substrate attached to the first substrate;
a gas chamber between the first and second substrates, the gas chamber containing
a metallic hydride film from which a gas disassociates when the film is
heated by a heating source;
a conduit in communication with the gas chamber, wherein the conduit contains the liquid material to be ejected; and
an ejection port in communication with the conduit through which the liquid material is ejected out of the apparatus and onto the work piece.

19. The apparatus of claim 18, wherein the liquid material is solder.

20. The apparatus of claim 18, wherein the metallic hydride film is $TiH_2$.

21. The apparatus of claim 18, wherein the metallic hydride film consists of $TiH_2$ islands.

22. The apparatus of claim 18, further comprising a reservoir mounted to the second substrate and in communication with the conduit through the second substrate to provide the liquid material thereto.

23. The apparatus of claim 22, wherein both the conduit and the reservoir have a surface in contact with the liquid material and wherein the conduit surface and the reservoir surface are coated with a non-oxidizable metal.

24. The apparatus of claim 22, further including a heating element in proximity to the reservoir to heat the liquid material.

25. The apparatus of claim 24, wherein the heating element appears within the second substrate.

26. The apparatus of claim 18, wherein the apparatus is disposable.

27. The apparatus of claim 18, wherein the conduit has a surface in contact with the liquid material and wherein the conduit surface is coated with a non-oxidizable metal.

28. The apparatus of claim 18, further comprising a laser acting as the heating source, wherein the laser transmits through the first substrate and strikes the metallic hydride film to disassociate hydrogen therefrom into the gas chamber.

29. The apparatus of claim 18, further comprising a heating element acting as the heating source, wherein the heating element heats the metallic hydride film to disassociate hydrogen therefrom into the gas chamber.

30. The apparatus of claim 18, wherein the metallic hydride film is comprised of a plurality of metallic hydride film islands.

31. The apparatus of claim 18, further comprising an insulator which thermally isolates the metallic hydride film from the other components of the apparatus.

32. The apparatus of claim 18, further comprising a cooling device in proximity to the gas chamber for drawing heat therefrom.

33. The apparatus of claim 32, wherein the cooling device is a cooling fin.

34. The apparatus of claim 18, wherein the work piece is an integrated circuit.

35. The apparatus of claim 18, wherein the first substrate is a glass.

36. The apparatus of claim 18, wherein the second substrate is a semiconductor wafer.

37. An apparatus for ejecting liquid solder out an ejection port onto a work piece, comprising:
a gas chamber;
a conduit in communication with the gas chamber, wherein the conduit contains the liquid solder to be ejected;
an ejection port in communication with the conduit; and
means for pressuring the gas chamber to eject the liquid solder in the conduit out the ejection port.

38. The apparatus of claim 37, wherein the means for pressurizing the gas chamber include a metallic hydride film that is heated by a laser to disassociate hydrogen therefrom.

39. The apparatus of claim 37, wherein the means for pressurizing the gas chamber includes a metallic hydride film that is heated by a heating element to disassociate hydrogen therefrom.

40. The apparatus of claim 39, wherein the metallic hydride film is $TiH_2$.

41. The apparatus of claim 39, wherein the metallic hydride film is $TiH_2$.

42. The apparatus of claim 41, wherein the $TiH_2$ is formed in islands.

43. The apparatus of claim 39, further including an insulator which thermally isolates the metallic hydride film from the other components of the apparatus.

44. The apparatus of claim 37, further comprising a reservoir in communication with the conduit to provide the liquid solder thereto.

45. The apparatus of claim 37, wherein the apparatus is disposable.

46. The apparatus of claim 37, further comprising a cooling device in proximity to the gas chamber for drawing heat therefrom.

* * * * *